(12) United States Patent
Holden et al.

(10) Patent No.: US 6,266,522 B1
(45) Date of Patent: Jul. 24, 2001

(54) APPARATUS AND METHODS FOR TUNING BANDPASS FILTERS

(75) Inventors: Alan R. Holden, Apex; Antonio Montalvo; Richard H. Myers, both of Raleigh, all of NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/018,513

(22) Filed: Feb. 4, 1998

(51) Int. Cl.$^7$ ..................................................... H04B 1/16
(52) U.S. Cl. ............................ 455/339; 455/340; 455/125
(58) Field of Search ...................................... 455/210, 211, 455/266, 307, 308, 339, 340; 375/344

(56) References Cited

U.S. PATENT DOCUMENTS

| | | | |
|---|---|---|---|
| 3,792,357 | * | 2/1974 | Hekimian et al. ................... 455/266 |
| 3,953,849 | * | 4/1976 | Couvillon ............................ 342/100 |
| 4,232,398 | * | 11/1980 | Gould et al. ....................... 455/226.3 |
| 4,316,108 | * | 2/1982 | Rogers, Jr. ........................... 455/340 |
| 4,531,148 | * | 7/1985 | Ohta et al. ............................ 455/340 |

(List continued on next page.)

FOREIGN PATENT DOCUMENTS

| | | | |
|---|---|---|---|
| 195 40 139 | 4/1997 | (DE) | ................................ H03J/5/00 |
| 0 003 634 | 8/1979 | (EP) | ................................ H03J/3/14 |
| 0 726 652 | 8/1996 | (EP) | ................................ H03J/3/16 |
| WO 90/15339 | 12/1990 | (WO) . | |

OTHER PUBLICATIONS

International Search Report, PCT/US99/02424, Jun. 4, 1999.
Schaumann et al., "The Problem of On–Chip Automatic Tuning in Continuous–time Integrated Filters", Reprinted from IEEE Proc. ISCAS, 1989, pp. 106–109.
Plett et al., "Continuous Time Filters Using Open Loop Tuneable Transconductance Amplifiers", Reprinted from IEEE Proc. ISCAS, 1986, pp. 1173–1176.

*Primary Examiner*—Vivian Chang
*Assistant Examiner*—Duc Nguyen
(74) *Attorney, Agent, or Firm*—Myers Bigel Sibley & Sajovec

(57) ABSTRACT

A signal having a substantially uniform spectral distribution, e.g., a flat noise signal such as a signal ground, is provided at the input of a bandpass filter such as an IF filter of a receiver circuit, to thereby produce an output signal at the output of the bandpass filter. The output signal is processed in a limiter to produce a limited signal. An average frequency of the limited signal is determined, and the bandpass filter is adjusted based on the determined average frequency. According to one embodiment of the present invention, the bandpass filter comprises a Gm-C filter having a transconductance, and the filter is adjusted by adjusting the transconductance of the Gm-C filter based on the determined average frequency. According to another aspect of the present invention, a desired center frequency for the bandpass filter is identified. A resolution and a desired confidence interval are also identified. The number of samples of the limited signal needed to achieve the identified desired resolution and confidence interval is determined based on the identified desired center frequency. An average frequency is determined by sampling the limited signal to obtain a plurality of samples, the number of the plurality of samples being at least as great as the determined number of samples of the limited signal to achieve the identified desired resolution and confidence level, and determining the average frequency from the plurality of samples. The bandpass filter is adjusted based on the determined average frequency to achieve a center frequency for the bandpass filter that is within a predetermined range with respect to the desired center frequency . Related apparatus are also discussed.

18 Claims, 3 Drawing Sheets

U.S. PATENT DOCUMENTS

| | | | |
|---|---|---|---|
| 4,621,645 | * 11/1986 | Flax | 128/660 |
| 4,679,247 | * 7/1987 | Washburn, Jr. | 455/210 |
| 4,695,792 | * 9/1987 | Roy | 455/340 |
| 4,731,872 | * 3/1988 | Washburn, Jr. | 455/210 |
| 5,404,589 | 4/1995 | Bijker et al. | 455/200.1 |
| 5,408,196 | * 4/1995 | Sempel et al. | 329/325 |
| 5,440,264 | 8/1995 | Sevenhans et al. | 327/553 |
| 5,471,168 | 11/1995 | Sevenhans et al. | 327/553 |
| 5,564,093 | * 10/1996 | Matsumoto | 455/266 |
| 5,566,211 | * 10/1996 | Choi | 375/332 |
| 5,661,432 | 8/1997 | Chang et al. | 327/552 |
| 5,666,083 | 9/1997 | Myers et al. | 327/553 |
| 5,926,752 | * 7/1999 | Lin | 455/323 |
| 5,945,889 | * 9/1999 | Shanthi-Pavan et al. | 455/125 |
| 5,949,832 | * 9/1999 | Liebetreu et al. | 375/344 |

* cited by examiner

APPARATUS AND METHODS FOR TUNING BANDPASS FILTERS

FIELD OF THE INVENTION

The present invention relates to electronic circuits and methods of operation thereof, and more particularly, to filter circuits and methods of operation thereof.

BACKGROUND OF THE INVENTION

Traditional superheterodyne radio receiver designs typically use passive intermediate frequency (IF) filters. In many advanced receiver circuit designs, in particular, receiver designs implemented using application specific integrated circuits (ASICs), passive filters have been replaced with active filters that typically are more easily implemented in an ASIC. An active filter structure commonly used in ASIC-based IF circuits is the so-called "Gm-C" filter, which uses transconductance amplifiers and capacitor gyrators to simulate inductors.

The transconductance and capacitance of an integrated circuit Gm-C IF filter can vary with fabrication process conditions. Variations in temperature and power supply voltage can also cause variation of the transfer characteristics of the filter, which may require periodic re-tuning to maintain the passband shape and center frequency. Traditional approaches to tuning Gm-C filters include master-slave tuning techniques, as described in "The Problem of On-Chip Automatic Tuning in Continuous-Time Integrated Filters," Schauman et al., *IEEE Proceedings of ISCAS*, pp. 106–109, 1989. According to this type of approach, a duplicate (master) filter is formed on the same chip with the IF filter. A reference signal is applied to the duplicate filter to determine its transfer characteristics, and the IF (slave) filter is adjusted accordingly based on the assumption that the characteristics of the master and slave filters are closely matched.

The conventional master/slave tuning technique can be disadvantageous for a number of reasons. To achieve accurate tuning, the components of the master and slave filters generally must be very closely matched. In addition, the additional master filter generally consumes chip area that could be better utilized for other circuitry. Accordingly, there is a need for improved tuning methods and apparatus for tuning receiver filter circuits.

SUMMARY OF THE INVENTION

In light of the foregoing, it is an object of the present invention to provide improved methods and apparatus for tuning bandpass filters such as the IF filters employed in a radio communications circuit.

It is another object of the present invention to provide improved methods and apparatus for tuning bandpass filters that can be implemented using fewer components than conventional techniques.

It is yet another object of the present invention to provide improved methods and apparatus for tuning an IF filter in a radio receiver circuit which can be implemented using existing components of the radio receiver circuit.

These and other objects, features and advantages are provided according to the present invention by methods and apparatus in which a bandpass filter, such as an IF filter of a radio receiver circuit, is tuned by providing a signal having a substantially uniform spectral distribution to the input of the filter, determining an average frequency for a limited signal produced by a limiter following the filter, and adjusting the filter based on the determined average frequency. A sampling interval may be determined based on the desired center frequency for the filter and a desired confidence interval, and the limited signal sampled for the desired sampling interval to achieve a plurality of samples from which an average frequency can be determined. The samples may be obtained by processing the limited signal using a detector included in the receiver circuit. The filter may be Gm-C filter that has a transconductance which is adjustable responsive to a control signal applied to the filter. The control signal may be produced based on the determined average frequency. The filter may be adjusted based on the determined average frequency until a center frequency is achieved which is within a predetermined range with respect to a desired center frequency.

The present invention arises from the realization that in applying a spectrally uniform signal to the input of the bandpass filter, it can be expected that the limited signal produced by the limiter will have a spectrum which has an approximately Gaussian distribution around the center frequency of the bandpass filter. Accordingly, by sampling the limited signal and determining an average frequency thereof, an estimate of the center frequency of the bandpass filter can be obtained with a desired resolution and confidence level. Because the limiter and detector are components normally present in the radio receiver circuit, additional circuitry, such as a master reference filter matched to the bandpass filter, is not required. As the bandpass filter can otherwise be designed such that the passband shape is resistant to variations due to temperature and power supply fluctuations, tuning of the center frequency of the bandpass filter can be performed upon power-up of the receiver circuit.

In particular, according to the present invention, a signal having a substantially uniform spectral distribution is provided at the input of a bandpass filter to thereby produce an output signal at the output of the bandpass filter. The output signal is processed in a limiter to produce a limited signal. An average frequency of the limited signal is determined, and the bandpass filter is adjusted based on the determined average frequency. According to one embodiment of the present invention, the bandpass filter comprises a Gm-C filter having a transconductance, and the filter is adjusted by adjusting the transconductance of the Gm-C filter based on the determined average frequency.

According to another aspect of the present invention, a desired center frequency for the bandpass filter is identified. A resolution and a desired confidence interval are also identified. The number of samples of the limited signal needed to achieve the identified desired resolution and confidence interval is determined based on the identified desired center frequency. An average frequency is determined by sampling the limited signal to obtain a plurality of samples, the number of the plurality of samples being at least as great as the determined number of samples of the limited signal to achieve the identified desired resolution and confidence level, and determining the average frequency from the plurality of samples. The bandpass filter is adjusted based on the determined average frequency to achieve a center frequency for the bandpass filter that is within a predetermined range with respect to the desired center frequency. The sampling, determining, and adjusting steps may be repeatedly performed until the average frequency is within a predetermined range with respect to the desired center frequency.

According to another aspect of the present invention, an IF filter of a radio receiver circuit is tuned. The radio receiver circuit includes a limiter connected to an output of the IF filter. A signal having a substantially uniform spectral distribution is provided at an input of the IF filter to thereby produce an output signal at the output of the IF filter. The output signal is processed in the limiter to produce a limited signal. An average frequency of the limited signal is determined, and the IF filter is adjusted based on the determined average frequency. The IF filter may include a Gm-C filter having a transconductance, and adjustment of the filter may comprise adjusting the transconductance of the Gm-C filter according to the determined average frequency.

According to another aspect of the present invention, the IF filter has a passband within a range of frequencies. A noise signal having a substantially uniform spectral distribution within the range of frequencies is provided to the input of the IF filter. For example, the IF filter may be implemented in a circuit having a signal ground, and the radio receiver circuit may be configured to connect the input of the IF filter to one of a radio signal path or the signal ground. The noise signal may be provided by connecting the signal ground to the input of the IF filter. According to another related aspect, connection of the signal ground occurs in response to application of power to the radio receiver circuit. After adjustment of the IF filter, the input of the IF filter may be disconnected from the signal ground and the IF filter connected to a radio signal path.

An apparatus according to an embodiment of the present invention includes a bandpass filter including an input and an output. A signal generator provides a signal having a substantially uniform spectral distribution at the input of the bandpass filter to thereby produce an output signal at the output of the bandpass filter. A limiter is responsive to the bandpass filter and processes the output signal of the bandpass filter to produce a limited signal. Means are provided, responsive to the limiter, for determining an average frequency of the limited signal. Additional means are provided, responsive to the means for determining an average frequency, for adjusting the bandpass filter based on the determined average frequency.

In yet another embodiment according to the present invention, a radio receiver circuit includes an IF filter having an input and an output. Means are provided for providing a signal having a substantially uniform spectral distribution at the input of the IF filter to thereby produce an output signal at the output of the IF filter. A limiter is connected to the output of the IF filter, and limits the output signal to produce a limited signal. Means are responsive to the limiter for determining an average frequency of the limited signal. The means for determining an average frequency may include a detector, a digital signal processor (DSP) and a microcontroller as may be commonly found in a cellular radiotelephone receiver circuit, for example. Additional means are provided, responsive to the means for determining an average frequency, for adjusting the IF filter based on the determined average frequency. For example, the IF filter may include a Gm-C (transconductance) filter which is responsive to a control signal applied thereto, and the means for adjusting the IF filter may comprise means for generating the control signal. A receiver circuit that is tunable using commonly used receiver components is thereby provided.

DETAILED DESCRIPTION OF THE PREFERRED EMBODIMENTS

Figure 1:
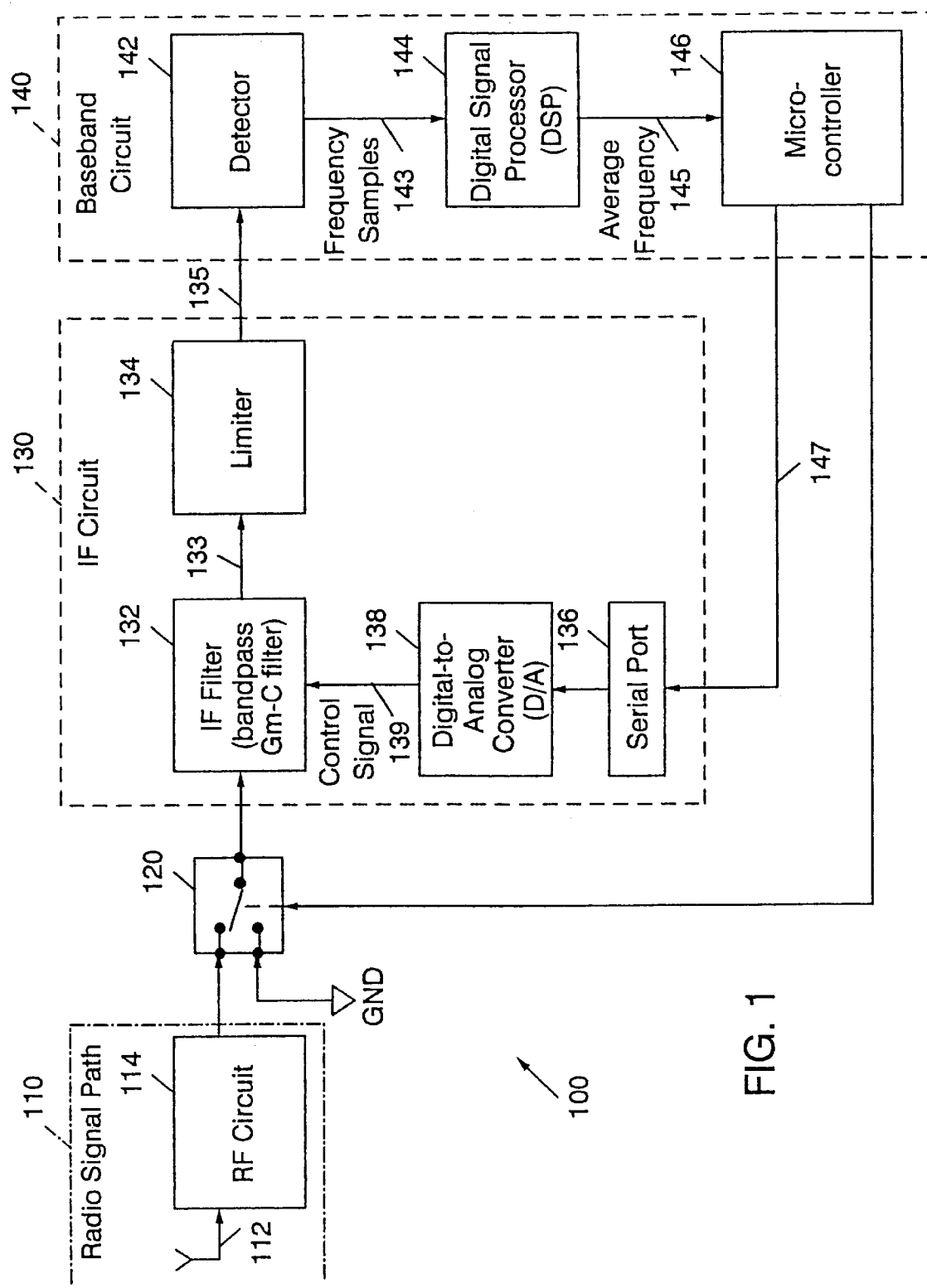
FIG. 1 is a schematic diagram illustrating a radio receiver circuit according to an embodiment of the present invention.

The present invention now will be described more fully hereinafter with reference to the accompanying drawings, in which embodiments of the invention are shown. Those skilled in the art will appreciate that the invention may be embodied in many different forms and should not be construed as limited to the embodiments set forth herein; rather, these embodiments are provided so that this disclosure will be thorough and complete, and will fully convey the scope of the invention to those skilled in the art. In the drawings, like numbers refer to like elements throughout.

For purposes of the discussion herein, descriptions of preferred embodiments utilizing Gm-C (transconductance) bandpass filters are provided. Those skilled in the art will appreciate, however, that the present invention need not be limited to Gm-C filters. It will be understood that in general, bandpass filters that have transfer characteristics that are adjustable may be used with the present invention.

Gm-C filters typically have a transfer characteristic that is adjustable by varying the transconductance of the filter. This may be accomplished in a number of ways, as transconductance amplifiers may have a wide variety of configurations. In a typical transconductance filter, for example, the center frequency of the filter passband is dependent on the ratio of the transconductance and the capacitance of the filter. A well-known technique for adjusting the transconductance of such a transconductance filter is to vary an externally-applied control signal to control a biasing point, as described in "Continuous Time Filters Using Open Loop Tuneable Transconductance Amplifiers," by C. Plett et al., IEEE Proc. ISCAS, pp. 1173–1176 (1986).

The present invention arises from the realization that the signal processing capabilities of limiters and detectors such as those commonly employed in radio receiver circuits may be used to determine transfer characteristics of a bandpass filter such as an IF filter without requiring extensive additional circuitry. A signal having a substantially uniform spectral distribution, e.g., a noise signal that has substantially flat spectral distribution within the nominal passband of the bandpass filter, is provided to a bandpass filter. According to aspects of the present invention, the output signal produced by the filter is processed in a limiter, and an average frequency is estimated for the limited signal. The estimated average frequency may then be used to adjust a transfer characteristic of the filter, e.g., to adjust the filter's center frequency.

According to a theoretical explanation which in no way limits the scope of the present invention, if a spectrally uniform signal is provided to a bandpass filter, the noise spectrum produced by the filter should approximate the filter's gain response, i.e., the largest amplitude components should occur in a frequency range corresponding to the filter's passband. The noise spectrum produced by the limiter should be similar, i.e., the frequency information should be preserved. Frequency samples can be conveniently obtained from the limited signal, and integrated for a predetermined time to obtain a measure of the filter's average frequency, i.e., an estimate of its center frequency.

The integration time can be found using statistical methods in order to gain a certain confidence that the calculated center frequency is within a desired tolerance of the actual center frequency of the filter. Assuming the limited signal has a Gaussian distribution, a confidence interval for estimating the center frequency of the bandpass filter may be determined. For example, for a 5σ confidence interval, 0.9999994 is the probability that the average frequency determined from the limited signal is the center frequency of the bandpass filter:

$$5\sigma = \frac{f_d}{\sqrt{2}},$$

and thus $$\sigma = \frac{f_d}{5\sqrt{2}},$$

where $f_d$ is the desired frequency resolution. The average frequency $F_c$ of the limited signal may be computed as:

$$F_c = \frac{1}{N}\sum_{n=1}^{N} F_n,$$

where N represents the number of frequency samples $F_n$. To achieve a given σ, the number of samples N is given by:

$$N = \left(\frac{BW_{rms}}{2\sigma}\right)^2,$$

where $BW_{rms}$ is the rms bandwidth of the system. The minimum sampling interval $T_s$ needed to produce the number of samples to achieve the desired confidence level is given by:

$$T_s = \frac{N}{f_{min}},$$

where $f_{min}$ is the lowest center frequency at which the bandpass filter can reside.

For example, for a system with a bandwidth of 30 kHz ($BW_{rms}$=21.213 kHz), a desired frequency resolution of 500 Hz, a lowest center freqeuncy $f_{min}$ of 70 kHz and a 5σ confidence level:

$$\sigma = \frac{500}{5\sqrt{2}} = 70.7 \text{ Hz},$$

$$N = \left(\frac{21.213\times 10^3}{2\times 70.7}\right)^2 = 22507 \text{ samples, and}$$

$$T_s = \frac{22507}{70 \text{ kHz}} = 0.3125 \text{ seconds}.$$

Accordingly, for this example, if 22507 samples are obtained over a sampling interval of 0.3125 seconds, assuming Gaussian noise at the output of the limiter, the average frequency calculated from the samples will be within ±500Hz of the actual center frequency of the bandpass filter to a probability of approximately 99.99994 %. It will be understood that if less resolution is desired, the number of samples and the sampling interval can be reduced.

FIG. 1 illustrates a radio receiver circuit 100 for receiving and processing radio signals according to an embodiment of the present invention. The receiver circuit 100 includes a radio signal path 110 including an antenna 112 and a radio frequency (RF) circuit 114. The RF circuit 114 is connected to the input of an intermediate frequency (IF) bandpass filter 132 of an IF circuit 130 via a switch 120. The switch 120 provides means for connecting one of the radio signal path 110 or a signal ground GND (or other signal having a substantially uniform spectral distribution) to the input of the IF filter 132. The IF circuit 130 also includes a limiter 134, which processes signals produced by the IF filter 132 to produce a limited signal 135. The limited signal 135 is passed to a detector 142 of a baseband circuit 140. The baseband circuit 140 also includes a digital signal processor (DSP) 144 and a microcontroller 146 for processing, for example, frequency or phase samples produced by the detector 142. The detector 142 may, for example, generate frequency samples 143 by detecting zero crossings of the limited signal 135, determining time intervals between successive zero crossings, and computing frequency samples based on the determined time intervals.

Those skilled in the art will recognize that the configuration of the radio receiver circuit 100 illustrated in FIG. 1 resembles that of a radio receiver circuit as is typically utilized, for example, in a cellular radiotelephone. According to aspects of the present invention, the IF filter 132 of the IF circuit 130 is adjustable responsive to a control signal 139 produced by a digital-to-analog (D/A) converter 138. The control signal 139 is generated by the D/A converter 138 responsive to a digital output 147 received from the microcontroller 146 via a serial port 136. The digital output 147 is derived from an average frequency 145 for the limited signal 135, as determined by the DSP 144 based on frequency samples 143 produced by the detector 142. Accordingly, standard radio receiver circuit hardware may be used to implement apparatus and methods according to the present invention.

Figure 2:
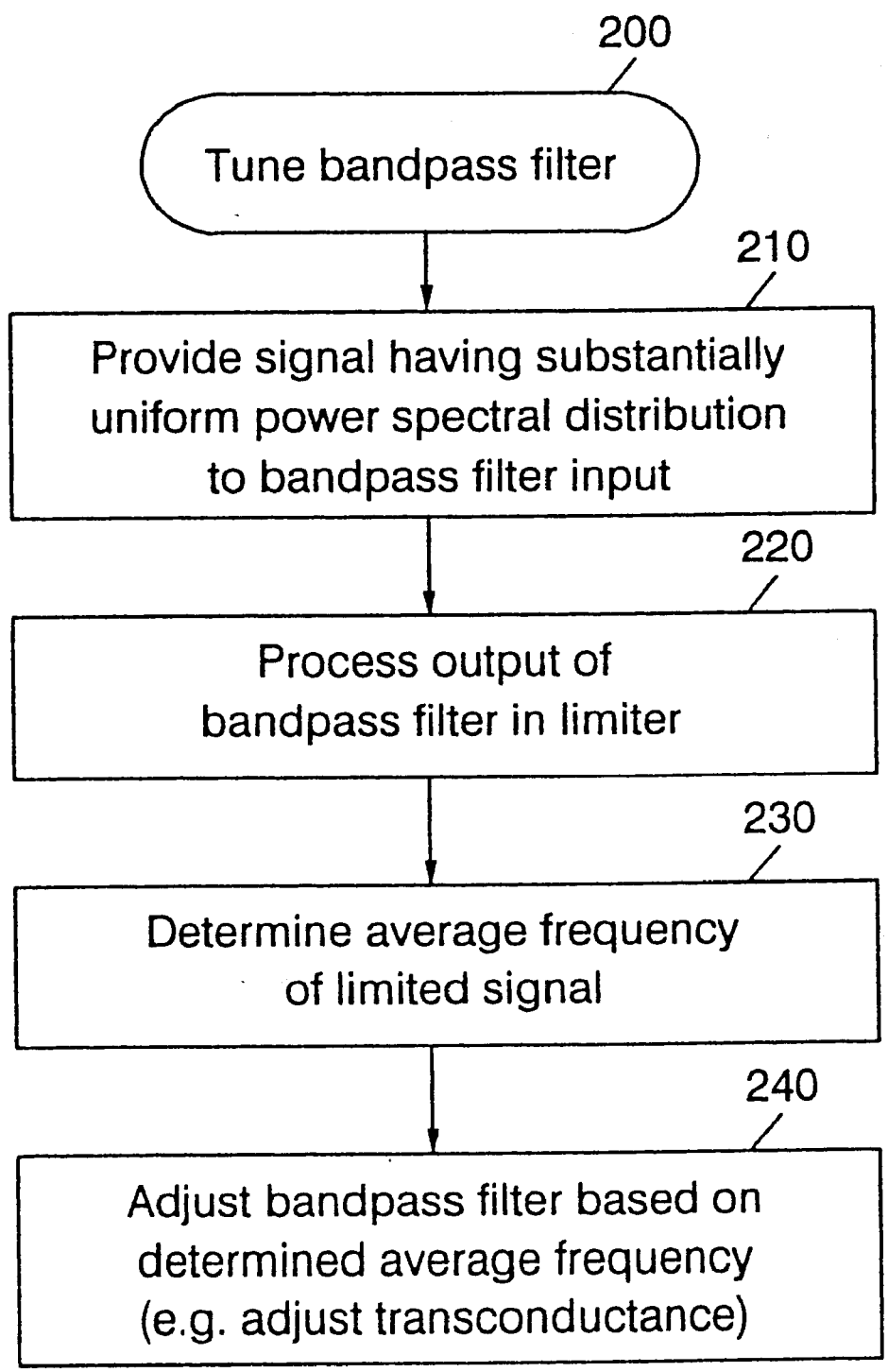
FIG. 2 is a flowchart illustration of operations for tuning a bandpass filter according to an aspect of the present invention.
Figure 3:
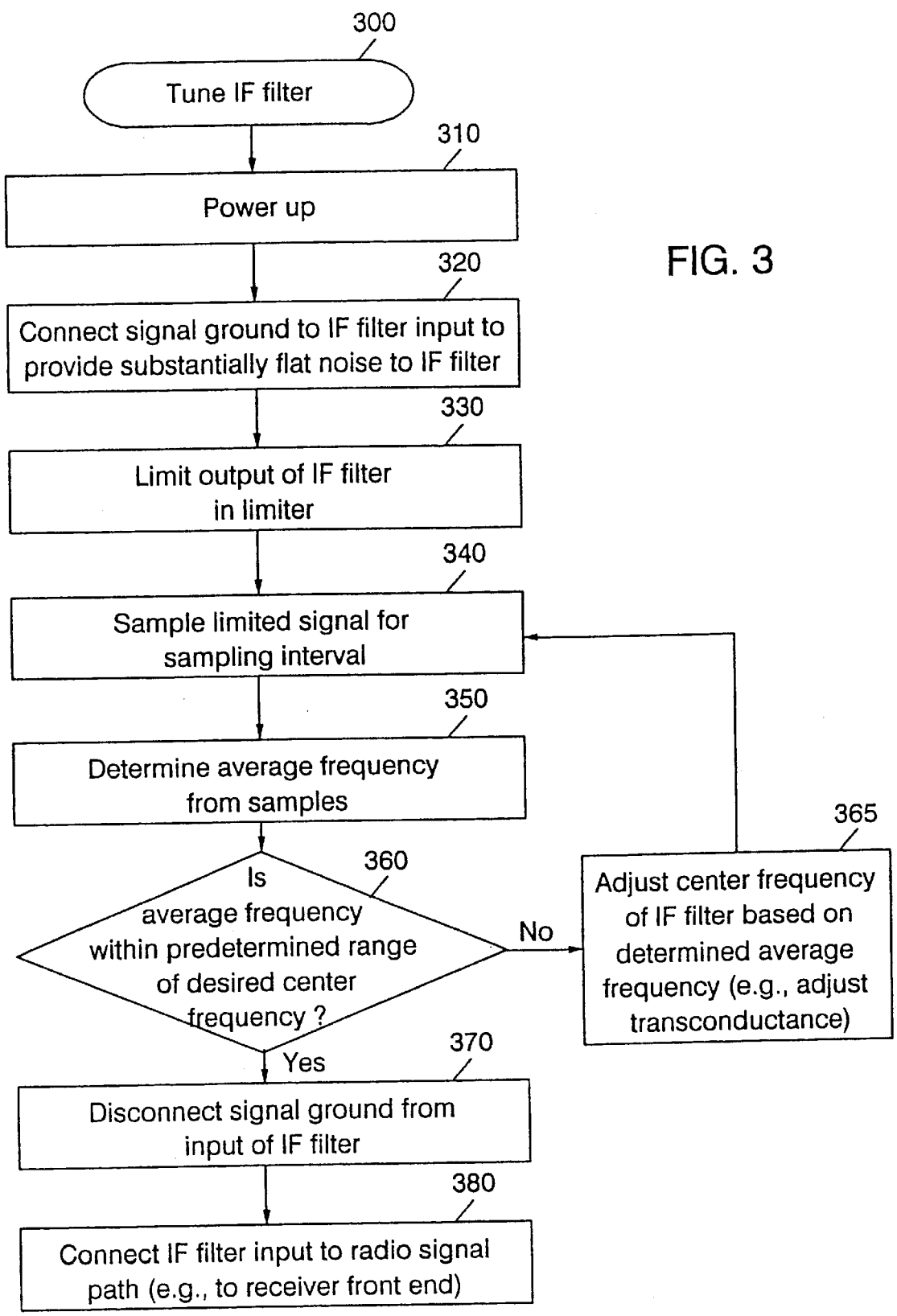
FIG. 3 is a flowchart illustration of operations for tuning an intermediate frequency (IF) filter in a radio receiver circuit according to an aspect of the present invention.

The flowchart illustrations of FIGS. 2 and 3 illustrate, respectively, basic operations for tuning a bandpass filter according to a first embodiment of the present invention, and detailed operations for tuning an IF bandpass filter in a radio receiver circuit according to second embodiment of the present invention. It will be understood that blocks of the flowchart illustrations, and combinations of blocks in the flowchart illustration, can be implemented by computer program instructions which may be loaded onto a computer or other programmable data processing apparatus to produce a machine such that the instructions which execute on the computer or other programmable data processing apparatus create means for implementing the functions specified in the flowchart block or blocks. The computer program instructions may also be loaded onto a computer or other programmable data processing apparatus to cause a series of operational steps to be performed on the computer or other programmable apparatus to produce a computer implemented process such that the instructions which execute on the computer or other programmable apparatus to provide steps for implementing the functions specified in the flowchart block or blocks. Accordingly, blocks of the flowchart illustrations support combinations of means for performing the specified functions and combinations of steps for performing the specified functions. It will also be understood that each block of the flowchart illustrations, and combinations of blocks in the flowchart illustrations, can be implemented by special purpose hardware which performs the specified functions or steps, or combinations of special purpose hardware such as microprocessors, digital signal processing (DSP) chips, application-specific integrated circuits (ASICS) or the like (such as the DSP 144 and the microcontroller 146 of FIG. 1) which execute computer instructions.

Referring to FIG. 2, operations (Block 200 et seq.) for tuning a bandpass filter include providing a signal having a substantially uniform spectral distribution, such as a flat noise signal, to the input of the bandpass filter (Block 210). The output of the bandpass filter is then processed in a limiter to produce a limited signal (Block 220). An average frequency is determined for the limited signal (Block 230). The bandpass filter is then adjusted, e.g., the center frequency of the bandpass filter is adjusted based on the determined average frequency (Block 240). For example, where the bandpass filter is a transconductance filter, the center frequency may be adjusted by adjusting the transconductance of the filter based on the determined average frequency.

Referring now to FIG. 3, operations (Block 300 et seq.) for tuning an IF filter in a radio receiver circuit include powering up the radio receiver circuit (Block 310). In response to power up, a signal ground is connected to the input of the IF filter (Block 320) to provide substantially flat noise thereto. The resulting output of the IF filter is then processed in a limiter (Block 330). The limited signal is sampled for a sampling interval to produce a plurality of frequency samples (Block 340), and an average frequency is determined from the samples (Block 350). If the determined average frequency is not within a predetermined range of the desired center frequency for the IF filter, the center frequency of the IF filter is adjusted, e.g., by adjusting the transconductance of a Gm-C filter, and a new average frequency is determined (Blocks 360, 365, 340, 350). If the determined average frequency is within the predetermined range, the signal ground is then disconnected from the input of the IF filter, and the input of the IF filter is connected to a radio signal path, e.g., to the receiver front end (Blocks 360, 370, 380).

With reference to FIG. 1, to adjust the filter, computing means such as the microcontroller 146 of FIG. 1 may generate a digital output to adjust the center frequency of the bandpass filter based on the determined average frequency. The digital word is in turn converted into the biasing control signal applied to adjust the center frequency of the filter, e.g., by adjusting the filter transconductance. The appropriate digital output may be determined based on a known relationship between the center frequency of the filter and the biasing control signal applied thereto. Typical relationships between biasing signals and transconductance in a transconductance filter are described in the aforementioned article by Plett et al.

It will be appreciated that numerous variations on the above-described operations may be performed that are within the scope of the present invention. For example, instead of performing adjustment of the IF filter in response to powerup, the above-described adjustment procedures may be performed periodically, in response to mode changes in the receiver circuit, and the like. Similarly, in cases where the bandpass (e.g., IF) filter is implemented using a structure other than a Gm-C filter, adjustment of the filter may occur by other means than by changing transconductance.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A method of tuning a bandpass filter having an input and an output, the method comprising the steps of:

identifying a desired center frequency for the bandpass filter;

identifying a desired resolution and a desired confidence interval;

determining a number of samples of the limited signal to achieve the identified desired resolution and confidence interval based on the identified desired center frequency;

providing a signal having a substantially uniform spectral distribution at the input of the bandpass filter to thereby produce an output signal at the output of the bandpass filter;

processing said output in a limiter to produce a limited signal;

sampling the limited signal to obtain a plurality of samples, the number of the plurality of samples being at least as great as the determined number of samples of the limited signal to achieve the identified desired confidence level;

determining an average frequency from th plurality of samples; and adjusting the bandpass filter based on the determined average frequency to achieve a center frequency for the bandpass filter which is within a predetermined range with respect to the desired center frequency.

2. A method according to claim 1, wherein said steps of sampling, determining an average frequency, and adjusting the bandpass filter are repeatedly performed until the average frequency is within a predetermined range with respect to the desired center frequency.

3. A method according to claim 1:

wherein said step of sampling is preceded by the step of determining a sampling interval based on the determined number of samples of the limited signal to achieve the identified resolution and confidence interval; and wherein said step of sampling comprises the step of sampling the limited signal over the determined sampling interval to obtain the plurality of samples.

4. A method according to claim 3, wherein said step of determining an average frequency from the plurality of samples comprises the steps of:

detecting a plurality of zero crossings of the limited signal occurring during the sampling interval; and determining an average frequency for the limited signal from the detected plurality of zero crossings.

5. A method of tuning an IF filter of a radio receiver circuit, the method comprising the steps of:

identifying a desired center frequency for the IF filter;

identifying a desired resolution and a desired confidence interval;

determining a number of samples of the limited signal to achieve the identified desired resolution and confidence interval based on the identified desired center frequency;

providing a signal having a substantially uniform spectral distribution at the input of the bandpass filter to there by produce an output signal at the output of the bandpass filter;

processing the output signal in a limiter to produce a limited signal;

sampling the limited signal to obtain a plurality of samples, the number of the plurality of samples being at least as great as the determined number of samples of the limited signal to achieve the identified desired confidence level;

determining an average frequency from the plurality of samples; and adjusting the IF filter based on the determined average frequency to achieve a center frequency for the IF filter which is within a predetermined range with respect to the desired center frequency.

6. A method according to claim 5, wherein said steps of sampling, determining an average frequency, and adjusting the IF filter are repeatedly performed until the determined average frequency is within a predetermined range with respect to the desired center frequency.

7. A method according to claim 5:

wherein said step of sampling is preceded by the step of determining a sampling interval based on the determined number of samples of the limited signal to achieve the identified resolution and confidence interval; and wherein said step of sampling comprises the step of sampling the limited signal over the determined sampling interval to obtain the plurality of samples.

8. A method according to claim 5, wherein said step of determining an average frequency from the plurality of samples comprises the steps of:

detecting a plurality of zero crossings of the limited signal occurring during the sampling interval; and determining an average frequency for the limited signal from the detected plurality of zero crossings.

9. An apparatus, comprising:

a bandpass filter including an input and an output;

a signal generator which provides a signal having a substantially uniform spectral distribution at said input of said bandpass filter to thereby produce an output signal at said output of said bandpass filter;

a limiter which processes the output signal of said bandpass filter to produce a limited signal;

means for identifying a desired center frequency for said bandpass filter;

means for identifying a desired resolution and a desired confidence interval;

means, responsive to said means for identifying a desired center frequency and to said means for identifying a desired resolution and confidence interval, for determining a number of samples of the limited signal to achieve the identified desired resolution and confidence interval based on the identified desired center frequency;

means, responsive to said limiter, sampling the limited signal to obtain a plurality of samples from the limited signal, the number of the plurality of samples being at least as great as the determined number of samples of the limited signal to achieve the identified desired confidence level;

means, responsive to said sampling means, for determining an average frequency from the plurality of samples; and means for adjusting said bandpass filter based on the determined average frequency to achieve a center frequency for said bandpass filter which is within a predetermined range with respect to the desired center frequency.

10. An apparatus according to claim 9, further comprising means, responsive to said means for identifying a desired center frequency and to said means for identifying a desired resolution and confidence interval, for determining a sampling interval based on the determined number of samples of the limited signal to achieve the identified resolution and confidence interval; and wherein said sampling means comprises means for sampling the limited signal over the determined sampling interval to obtain the plurality of samples.

11. An apparatus according to claim 9, wherein said means for determining an average frequency from the plurality of samples comprises:

means, responsive to said limiter, for detecting a plurality of zero crossings of the limited signal occurring during the sampling interval; and means, responsive to said means for detecting a plurality of zero crossings, for determining an average frequency for the limited signal from the detected plurality of zero crossings.

12. A radio receiver circuit, comprising:

an IF filter having an input and an output;

means for providing a signal having a substantially uniform spectral distribution at an input of the IF filter to thereby produce an output sign at the output of the IF filter;

a limiter which limits the output signal to produce a limited signal;

means for identifying a desired center frequency for the IF filter;

means for identifying a desired resolution and a desired confidence interval;

means, responsive to said means for identifying a desired center frequency and to said means for identifying a desired resolution and confidence interval, for determining a number of samples of the limited signal to achieve the identified desired resolution and confidence interval based on the identified desired center frequency;

means, responsive to said limiter, for sampling the limited signal to obtain a plurality of samples, the number of the plurality of samples being at least as great as the determined number of samples of the limited signal to achieve the identified desired confidence level;

means, responsive to said sampling means, for determining an average frequency from the plurality of samples; and means for adjusting said IF filter based on the determined average frequency to achieve a center frequency for the IF filter which is within a predetermined range with respect to the desired center frequency.

13. A circuit according to claim 12, further comprising means for determining a sampling interval based on the determined number of samples of the limited signal to achieve the identified resolution and confidence interval, and wherein said sampling means comprises means for sampling the limited signal over the determined sampling interval to obtain the plurality of samples.

14. A circuit according to claim 13, wherein means for determining an average frequency from the plurality of samples comprises:

a detector which detects a plurality of zero crossings of the limited signal occurring during the sampling interval; and means, responsive to said detector, for determining an average frequency for the limited signal from the detected plurality of zero crossings.

15. An apparatus, comprising:

a bandpass filter including an input and an output and adjustable responsive to a control signal;

a signal generator which provides a broadband signal at said input of said bandpass filter to thereby produce an output signal at said output of said bandpass filter; and a limiter which processes the output signal produced by said bandpass filter to produce a limited signal;

a sampling circuit, responsive to said limiter, that samples the limited signal to obtain a plurality of samples from the limited signal, the number of the plurality of samples being at least as great as a number of samples of the limited signal needed to achieve a desired confidence level;

an average frequency determining circuit, responsive to said sampling circuit, that determines an average frequency from the plurality of samples; and a control signal generating circuit, responsive to said average frequency determining circuit, that generates said control signal based on the determined average frequency to achieve a center frequency for said bandpass filter which is within a predetermined range with respect to a desired center frequency.

16. An apparatus according to claim 15, wherein said average frequency determining circuit is operative to detect a plurality of zero crossings of the limited signal occurring during the sampling interval and to determine an average frequency for the limited signal from the detected plurality of zero crossings.

17. An apparatus according to claim 15, wherein said bandpass filter comprises an IF filter.

18. A circuit according to claim 17, wherein said average frequency determining circuit comprises:

a detector, responsive to said limiter, that detects a plurality of zero crossings of the limited signal occurring during the sampling interval; and a signal processor, responsive to said detector, that determines an average frequency for the limited signal from the detected plurality of zero crossings.

* * * * *

UNITED STATES PATENT AND TRADEMARK OFFICE
CERTIFICATE OF CORRECTION

PATENT NO.     : 6,266,522 B1                                        Page 1 of 1
DATED          : July 24, 2001
INVENTOR(S)    : Holden et al.

It is certified that error appears in the above-identified patent and that said Letters Patent is hereby corrected as shown below:

Column 10,
Line 21, change "sign" to -- signal --.

Signed and Sealed this

Twenty-fourth Day of February, 2004

JON W. DUDAS
*Acting Director of the United States Patent and Trademark Office*